(12) United States Patent
Choi et al.

(10) Patent No.: US 12,035,493 B2
(45) Date of Patent: Jul. 9, 2024

(54) DISPLAY DEVICE

(71) Applicant: SAMSUNG DISPLAY CO., LTD., Yongin-si (KR)

(72) Inventors: Myeong Il Choi, Hwaseong-si (KR); Sung-Hyun Kim, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/961,701

(22) Filed: Oct. 7, 2022

(65) Prior Publication Data

US 2023/0156943 A1 May 18, 2023

(30) Foreign Application Priority Data

Nov. 16, 2021 (KR) .......................... 10-2021-0158020

(51) Int. Cl.
  *H05K 5/00* (2006.01)
  *H05K 5/02* (2006.01)
(52) U.S. Cl.
  CPC .................. *H05K 5/0226* (2013.01)
(58) Field of Classification Search
  None
  See application file for complete search history.

(56) References Cited

U.S. PATENT DOCUMENTS 10,938,970 B1 *  3/2021  Lee .................... H04M 1/0268
11,570,914 B2 *  1/2023  Endo .................... G06F 1/1618

FOREIGN PATENT DOCUMENTS

| KR | 10-1669046 | 10/2016 |
| KR | 10-2017-0026747 | 3/2017 |
| KR | 10-1969065 | 8/2019 |
| KR | 10-2020-0131662 | 11/2020 |
| KR | 10-2216674 | 2/2021 |
| KR | 10-2256292 | 5/2021 |

\* cited by examiner

*Primary Examiner* — Imani N Hayman
*Assistant Examiner* — Rashen E Morrison
(74) *Attorney, Agent, or Firm* — F. Chau & Associates, LLC

(57) ABSTRACT

A display device includes: a first case and a second case connected to each other by a folding member; and a display panel that is at least partially disposed on a first surface of the first case, wherein a second surface of the first case is opposite to the first surface of the first case, wherein a third surface of the second case faces the second surface of the first case when the display device is in a folded state, and the third surface of the second case is coplanar with the second surface of the first case when the display device is in an unfolded state, wherein a first end portion of the display panel is fixed to the second case, and a position of a second end portion of the display panel is configured to change on the first surface of the first case.

20 Claims, 14 Drawing Sheets

DISPLAY DEVICE

CROSS-REFERENCE TO RELATED APPLICATION

This application claims priority under 35 U.S.C. § 119 to Korean Patent Application No. 10-2021-0158020 filed in the Korean Intellectual Property Office on Nov. 16, 2021, the disclosure of which is incorporated by reference herein in its entirety.

TECHNICAL FIELD

The present inventive concept relates to a display device.

DISCUSSION OF THE RELATED ART

A display device may be used in, for example, a mobile terminal, a smart phone, or a wearable terminal, and demand has been increasing for a display device in which a size of a display part may be changed from a relatively small size to a relatively large size to provide increased portability of the display device.

Particularly, when the display device is used in a foldable electronic device, an image may be displayed on a relatively small display part when the display device is in a folded state, and an image may be displayed on a relatively large display part when the display device is in an unfolded state.

In this case, a display panel for the relatively small display part and a display panel for the relatively large display part may be separately formed to be mounted in one electronic device, but since two separate display panels are used, manufacturing and maintenance costs may increase.

SUMMARY

Embodiments of the present inventive concept are to provide a display device that may provide a display part in a folded state and an unfolded state by using one display panel.

According to an embodiment of the present inventive concept, a display device includes: a first case and a second case connected to each other by a folding member; and a display panel that is at least partially disposed on a first surface of the first case, wherein a second surface of the first case is opposite to the first surface of the first case, wherein a third surface of the second case faces the second surface of the first case when the display device is in a folded state, and the third surface of the second case is coplanar with the second surface of the first case when the display device is in an unfolded state, wherein a first end portion of the display panel is fixed to the second case, and a position of a second end portion of the display panel is configured to change on the first surface of the first case.

In an embodiment of the present inventive concept, the display device further includes a rotating member connected to the first case, wherein the folding member and the rotating member are connected to respective end portions of the first case that are opposite to each other.

In an embodiment of the present inventive concept, the display panel is disposed on the rotating member.

In an embodiment of the present inventive concept, the position of the second end portion of the display panel is configured to change according to a rotation of the rotating member.

In an embodiment of the present inventive concept, a first display portion of the display panel is positioned on the first surface of the first case, and the first case and the second case overlap each other along a first direction that is substantially perpendicular to a surface of the first display portion when the display device is in the folded state.

In an embodiment of the present inventive concept, a first portion of the display panel is disposed between the second surface of the first case and the third surface of the second case facing each other along the first direction.

In an embodiment of the present inventive concept, the folding member and the first portion of the display panel are spaced apart from each other by a first distance.

In an embodiment of the present inventive concept, the first display portion of the display panel displays an image, and the first portion of the display panel does not display an image.

In an embodiment of the present inventive concept, the second end portion of the display panel is disposed closer to the folding member than to the rotating member.

In an embodiment of the present inventive concept, the second case includes an accommodating portion, and the first end portion of the display panel is disposed within the accommodating portion of the second case.

In an embodiment of the present inventive concept, when the display device is in the unfolded state, the first case and the second case are disposed to be parallel to each other, and a second display portion of the display panel is disposed on the second surface of the first case and the third surface of the second case.

In an embodiment of the present inventive concept, the second end portion of the display panel is disposed adjacent to the rotating member on the first surface of the first case.

In an embodiment of the present inventive concept, a height of the second surface of the first case and a height of the third surface of the second case are the same.

According to an embodiment of the present inventive concept, a display device includes: a first case and a second case connected to each other by a folding member; a rotating member connected to the first case; and a display panel that is at least partially disposed on a first surface of the first case, wherein a second surface of the first case is opposite to the first surface of the first case, and a third surface of the second case faces the second surface of the first case when the display device is in a first state, and the third surface of the second case is aligned with the second surface of the first case when the display device is in a second state, wherein a first end portion of the display panel is fixed to the second case, and a position of a second end portion of the display panel is configured to change on the first surface of the first case, and when the first case and the second case overlap each other, the display panel displays an image on a first display portion, and when the second surface of the first case and the third surface of the second case are aligned with each other, the display panel displays an image on a second display portion.

In an embodiment of the present inventive concept, the first display portion has a first width, and the second display portion has a second width greater than the first width.

In an embodiment of the present inventive concept, the second width is approximately twice the first width.

In an embodiment of the present inventive concept, the folding member and the rotating member are connected to respective end portions of the first case that are opposite to each other.

In an embodiment of the present inventive concept, the display panel overlaps the rotating member.

In an embodiment of the present inventive concept, the position of the second end portion of the display panel is configured to change according to a rotation of the rotating member.

According to an embodiment of the present inventive concept, a display device includes: a first case and a second case connected to each other by a folding member, wherein the first case and the second case are configured to rotate about the folding member; a rotating member disposed at a first end of the first case and configured to rotate; and a display panel that is at least partially disposed on a first surface of the first case, wherein a second surface of the first case is opposite to the first surface of the first case, wherein a third surface of the second case faces the second surface of the first case in a first direction when the display device is in a folded state, and the first case and the second case are arranged in a second direction when the display device is in an unfolded state, wherein the second direction crosses the first direction, wherein a first end portion of the display panel is fixed to the second case, and a position of a second end portion of the display panel is disposed on the first surface of the first case, and wherein, when the display device is in the folded state, a first portion of the display panel is disposed between the second surface of the first case and the third surface of the second case and is configured to move toward and away from the folding member as the rotating member rotates.

DETAILED DESCRIPTION OF THE EMBODIMENTS

Figure 1:
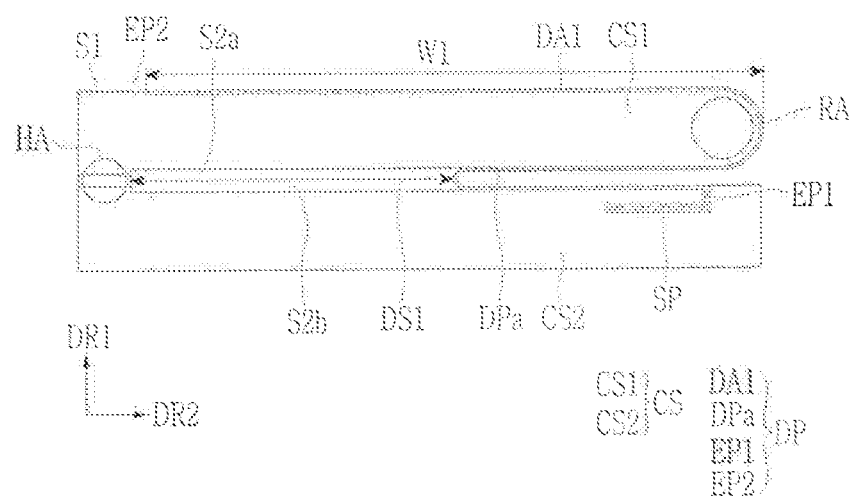
FIG. 1 illustrates a cross-sectional view of a first display unit, of a display device, in a first state, according to an embodiment of the present inventive concept.

Hereinafter, embodiments of the present inventive concept will be described in detail with reference to the accompanying drawings. As those skilled in the art would realize, the described embodiments may be modified in various different ways, all without departing from the spirit or scope of the present inventive concept.

In the drawings, like reference numerals may refer to like elements, and thus repetitive descriptions may be omitted.

In the drawings, the thicknesses of layers, films, panels, regions, areas, etc., may be exaggerated for clarity, and the present inventive concept is not limited to the illustrated sizes and thicknesses.

It will be understood that when an element such as a layer, film, region, area, or substrate is referred to as being "on" another element, it can be directly on the other element or intervening elements may also be present. In addition, when an element is referred to as being "directly on" another element, there are no intervening elements present.

Furthermore, throughout the specification, "connected" does not only mean when two or more elements are directly connected to each other, but also means that two or more elements are indirectly connected through other elements, and it may include a case where substantially integral parts are connected to each other even if they may be referred to by a different name depending on the position or function, as well as the case of being physically connected or electrically connected.

Figure 2:
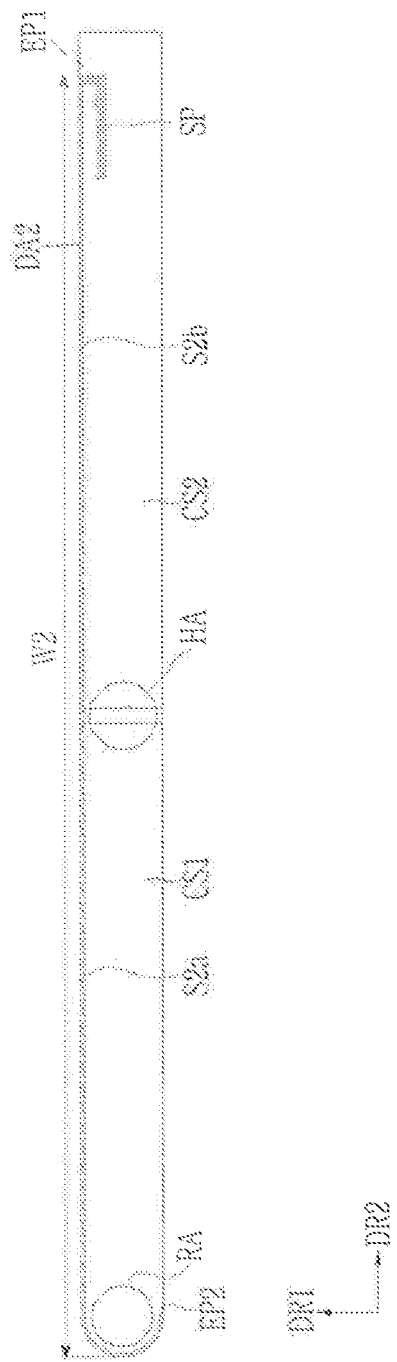
FIG. 2 illustrates a cross-sectional view of a second state of a display device according to an embodiment of the present inventive concept.
Figure 3:
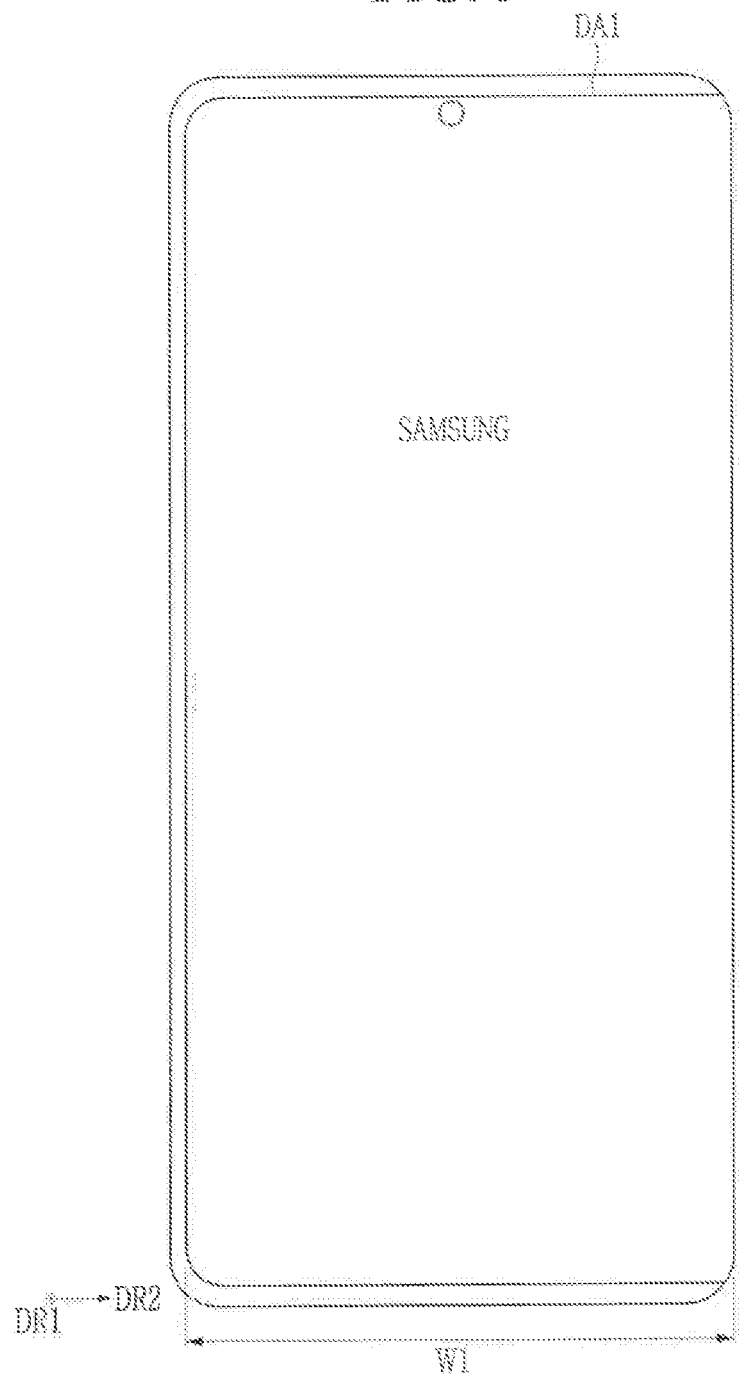
FIG. 3 illustrates a top plan view of a display device in a first state according to an embodiment of the present inventive concept.
Figure 4:
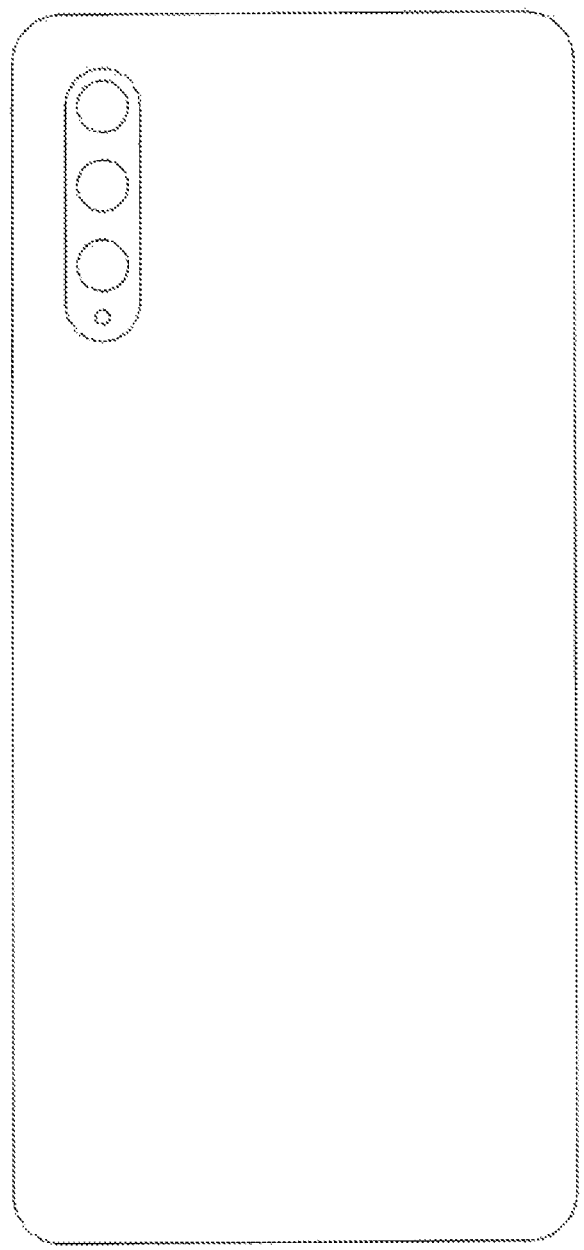
FIG. 4 illustrates a top plan view of a first rear surface, of a display device, in a first state, according to an embodiment of the present inventive concept.
Figure 5:
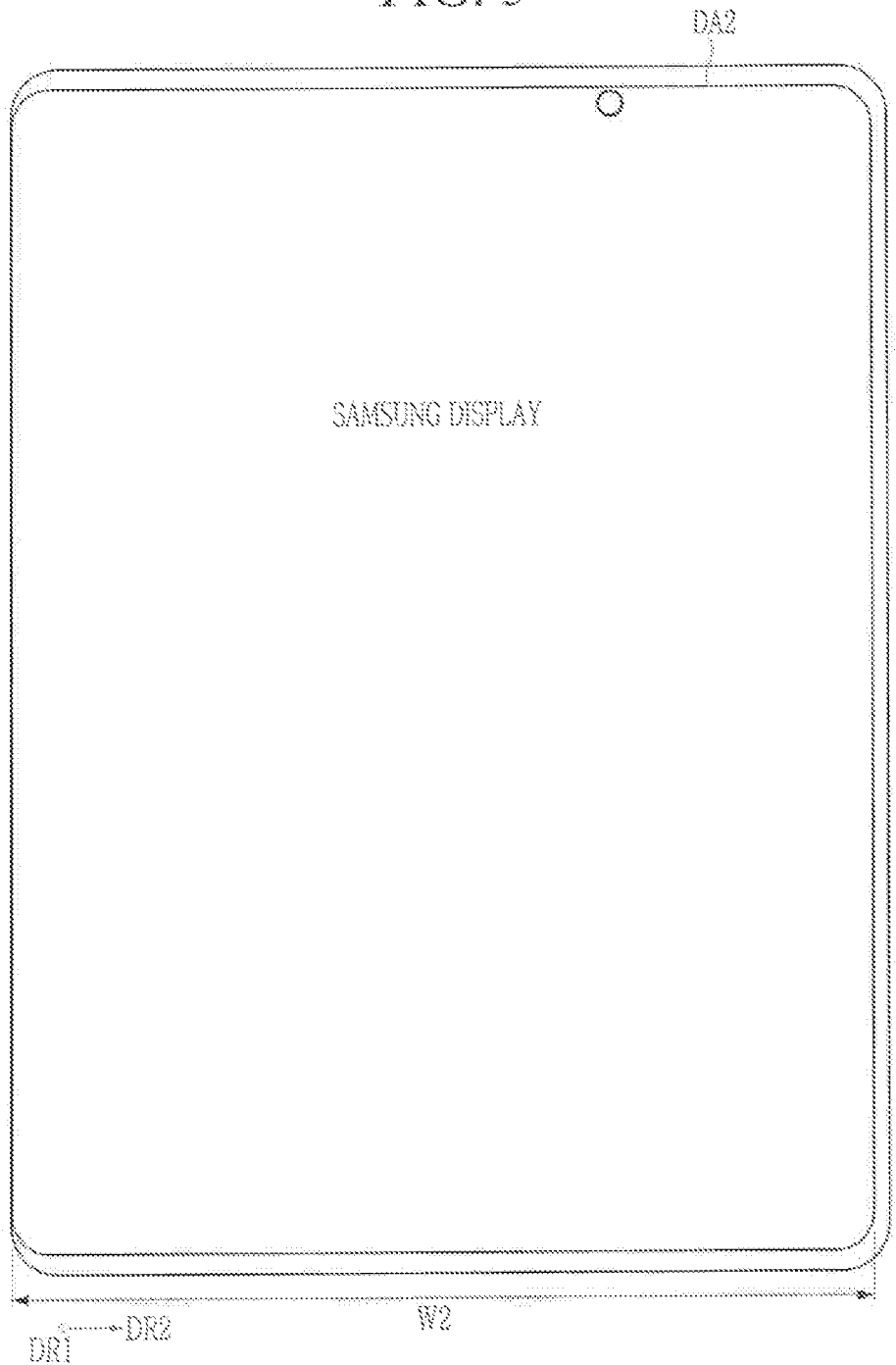
FIG. 5 illustrates a top plan view of a display device in a second state, according to an embodiment of the present inventive concept.
Figure 6:
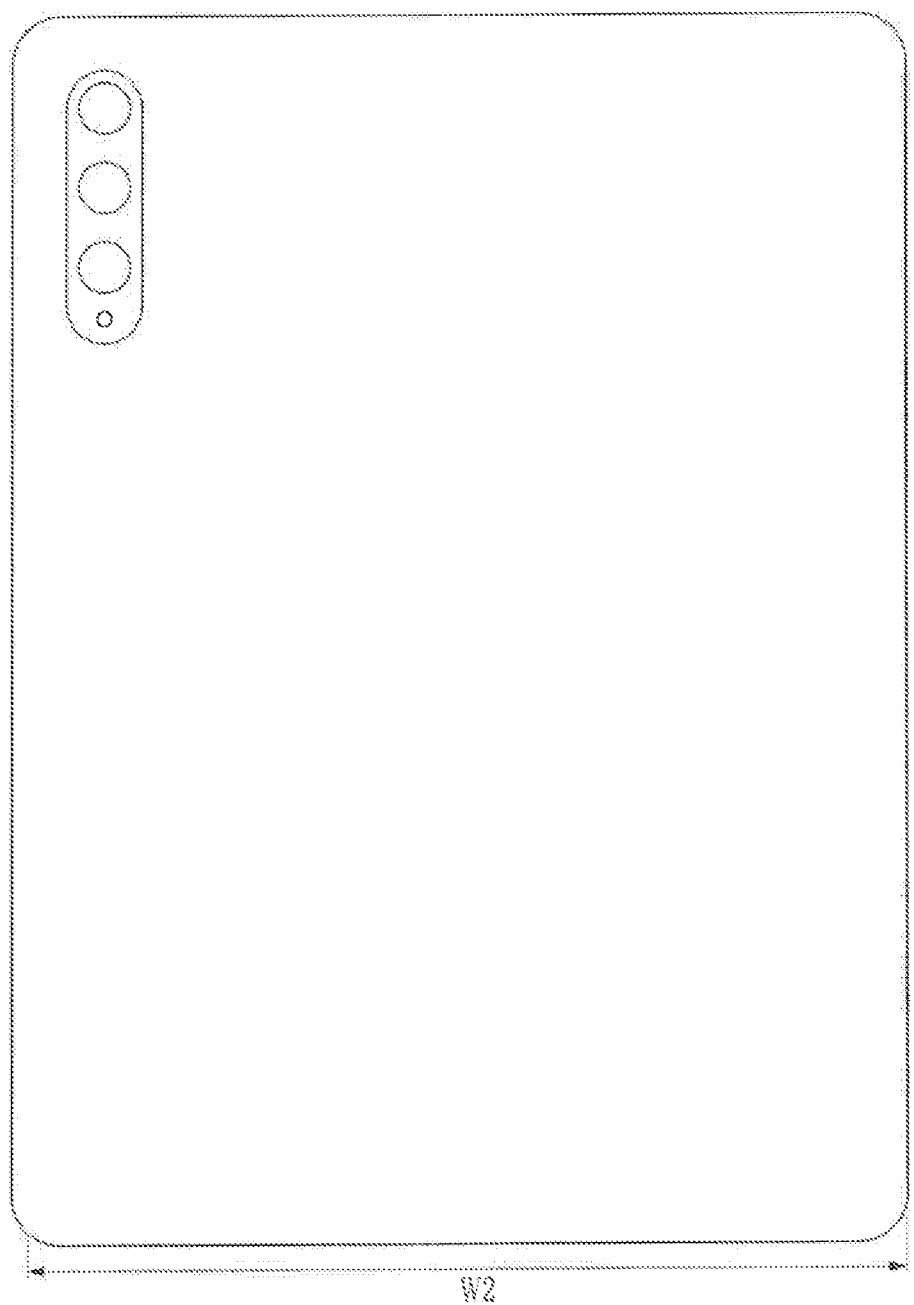
FIG. 6 illustrates a top plan view of a second rear surface, of a display device, in a second state, according to an embodiment of the present inventive concept.

A display device according to an embodiment of the present inventive concept will be described with reference to FIG. 1 to FIG. 6. FIG. 1 illustrates a cross-sectional view of a first display unit, of a display device, in a first state, according to an embodiment of the present inventive concept, and FIG. 2 illustrates a cross-sectional view of a second state of a display device according to an embodiment of the present inventive concept. FIG. 3 illustrates a top plan view of a display device in the first state according to an embodiment of the present inventive concept, and FIG. 4 illustrates a top plan view of a first rear surface, of a display device, in a first state according to an embodiment of the present inventive concept. FIG. 5 illustrates a top plan view of a display device in a second state, according to an embodiment of the present inventive concept, and FIG. 6 illustrates a top plan view of a second rear surface, of a display device, in a second state, according to an embodiment of the present inventive concept.

First, referring to FIG. 1 and FIG. 2, a display device according to an embodiment of the present inventive concept includes a display panel DP and a case CS supporting the display panel DP.

The case CS includes a first case (31 and a second case CS2 connected to each other through a folding member HA. The first case CS1 and the second case CS2, by using the folding member HA, may maintain the first state that is a folded state as shown in FIG. 1, or may maintain the second state that is an unfolded state as shown in FIG. 2.

Referring to FIG. 1, in the folded first state, the first case CS1 and the second case CS2 may overlap each other in a first direction DR1 that is substantially perpendicular to a surface of a first display portion DA1.

In the first state in which the display device is folded, a second surface S2a of the first case CS1 may face a third surface S2b of the second case CS2. In addition, the second surface S2a may face the first surface S1 of the first case CS1.

An accommodating portion SP may be formed in the second case CS2, and a first end portion EP1 of the display panel DP may be fixed in the accommodating portion SP of the second case CS2, while in the first state in which the display device is folded. In addition, a second end portion EP2 of the display panel DP may be disposed on the first surface S1 of the first case CS1, and may be disposed closer to the folding member HA than to a rotating member RA.

In the first state, in which the display device is folded, the first display portion DA1 of the display panel DP may be disposed on the first surface S1 of the first case CS1, and a first portion DPa of the display panel DP may be disposed between the second surface S2a of the first case CS1 and the third surface S2b of the second case CS2, which face each other.

In the first state, in which the display device is folded, the first portion DPa of the display panel DP and the folding member HA, which are disposed between the second surface S2a of the first case CS1 and the third surface S2b of the second case CS2, may be spaced apart from each other by a first distance DS1.

The rotating member RA is disposed at a first end portion of the first case CS1 that is opposite to a second end portion of the first case CS1, which is connected to the folding member HA. For example, the rotating member RA may be a roller. By rotation of the rotating member RA, the display panel DP may be moved on the first surface S1 of the first case CS1, the second surface S2a of the first case CS1, and the third surface S2b of the second case CS2. An area of the first portion DPa of the display panel DP disposed between the second surface S2a of the first case CS1 and the third surface S2b of the second case CS2 may be changed according to a folding operation and an unfolding operation of the display device.

In the first state, in which the display device is folded, the first display portion DA1 of the display panel DP may display an image while disposed on the first surface S1 of the first case CS1, but the first portion DPa of the display panel DP disposed between the second surface S2a of the first case CS1 and the third surface S2b of the second case CS2 might not display an image. As such, an image is displayed on a portion of the display panel DP, and no image is displayed on a portion of the display panel DP not viewed by the user, thereby reducing energy consumption such as power.

Referring to FIG. 2, in the second state, in which the display device is unfolded, the first case CS1 and the second case CS2 may be disposed in a line along a second direction DR2 parallel to the surface of the first display portion DAL. For example, in the second state, the first case CS1 and the second case CS2 may form a surface that is parallel to a plane extending in an x-axis direction and a y-axis direction. The second surface S2a of the first case CS1 and the third surface S2b of the second case CS2 may extend in a line to have the same height in the first direction DR1, and the first surface S1 of the first case (31 may be disposed below the second surface S2a of the first case CS1 in the first direction DR1. For example, the second surface S2a of the first case 31 and the third surface S2b of the second case (32 may be coplanar.

The first end portion EP1 of the display panel DP may be fixed into the accommodating portion SP of the second case CS2. The second end portion EP2 of the display panel DP may be disposed to be adjacent to the rotation member RA. Most of the display panel DP may be disposed on the second surface S2a of the first case (31 and the third surface S2b of the second case (32 to form a second display portion DA2.

Referring to FIG. 3 and FIG. 4 together with FIG. 1, in the first state, in which the display device is folded, the first display portion DA1 disposed on the first surface S1 of the first case CS1 of the display panel DP may display an image, and the first display portion DA1 may have a first width W1 along a direction parallel to the second direction DR2.

Referring to FIG. 5 and FIG. 6 together with FIG. 2, in the second state, in which the display device is unfolded, among the display panel DP, the second display portion DA2 disposed on the second surface S2a of the first case CS1 and the third surface S2b of the second case CS2 may display an image, and the second display portion DA2 may have a second width W2 along a direction parallel to the second direction DR2.

The second width W2 of the second display portion DA2 may be greater than the first width W1 of the first display portion DAL. For example, the second width W2 of the second display portion DA2 may be about twice the first width W1 of the first display portion DA1, but the present embodiment is not limited thereto.

According to the display device according to the present embodiment, the first end portion EP1 of the display panel DP is fixed in the accommodating portion SP of the second case CS2, and according to the folded state and the unfolded state of the display device, a position of the second end portion EP2 of the display panel DP may be changed on the first surface S1 of the first case CS1. For example, when the display device is being changed to the second state from the first state, the second end portion EP2 of the display panel DP may move closer to the rotating member RA. Through this, by using one display panel DP, an image is displayed on the first display portion DA1 having the first width W1 in the first state, in which the display device is folded, and an image is displayed on the second display portion DA2 having the second width W2 in the second state in which the display device is unfolded, thereby reducing the manufacturing cost of the display device and the driving cost of the display panel.

Hereinafter, steps in which the display device is changed from the first state to the second state will be described with reference to FIG. 7 to FIG. 10 along with FIG. 1 to FIG. 6.

Figure 7:
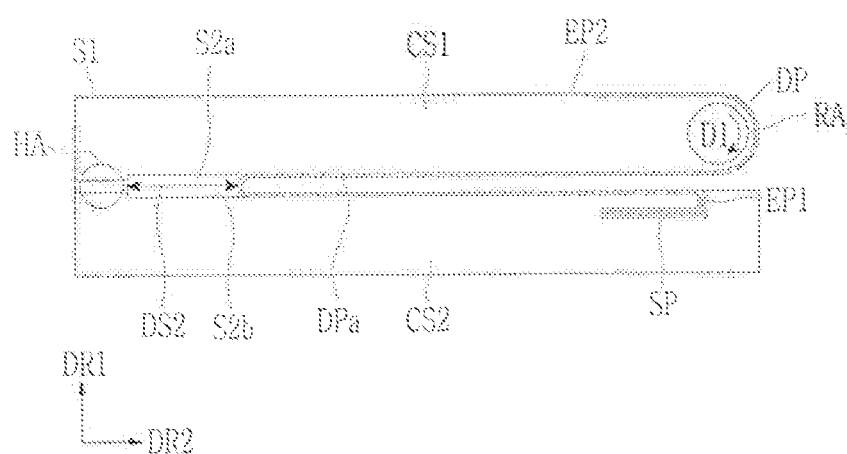
FIGS. 7, 8, 9 and 10 illustrate cross-sectional views of steps in which a display device is changed from a first state to a second state according to an embodiment of the present inventive concept.

Referring to FIG. 7, the rotating member RA rotates in the first direction D1, and as the rotating member RA rotates in a first rotating direction D1 (e.g., a rotating direction or a clockwise direction), the display panel DP may move toward a position between the second surface S2a of the first case CS1 and the third surface S2b of the second case CS2 while the rotating member RA rotates in the first rotating direction D1. A coupling member is disposed on a lower surface of the display panel DP and a surface of the rotating member RA, so that the display panel DP and the rotating member RA can move together according to the rotation of the rotating member RA. For example, the lower surface of the display panel DP may be in contact with the first case CS1.

As the rotating member RA rotates in the first rotating direction D1, the display panel DP moves, so that a second distance DS2 between the first portion DPa of the display panel DP and the folding member HA, which are disposed between the second surface S2a of the first case CS1 and the third surface S2b of the second case CS2, is narrower than the first distance DS1 between the first portion DPa of the display panel DP and the folding member HA as illustrated in FIG. 1. In addition, the second end portion EP2 of the display panel DP disposed on the first surface S1 of the first case CS1 moves closer to the rotating member RA as compared with the first state that is the folded state illustrated in FIG. 1 above.

Figure 8:
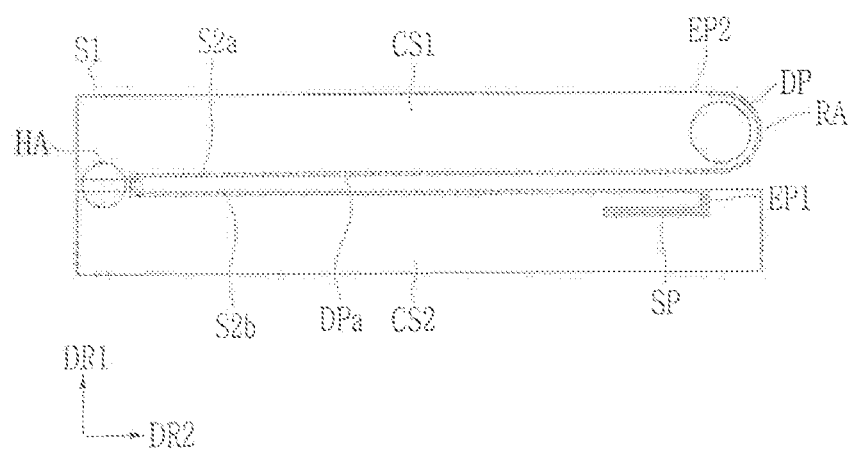

Referring to FIG. 8, as the rotating member RA continues to rotate in the first rotating direction D1, the display panel DP moves until the distance between the first portion DPa of the display panel DP and the folding member HA substantially becomes about 0, and the rotation of the rotating member RA stops. In this case, the second end portion EP2 of the display panel DP disposed on the first surface S1 of the first case CS1 is disposed adjacent to the rotating member RA as shown in FIG. 2 above. For example, except for the second end portion EP2 of the display panel DP, which is disposed on the first surface S1 of the first case CS1 and is adjacent to the rotating member RA, and the first end portion EP1 fixed in the accommodating portion SP of the second case CS2, most of the display panel DP is disposed between the second surface S2a of the first case CS1 and the third surface S2b of the second case CS2.

Figure 9:
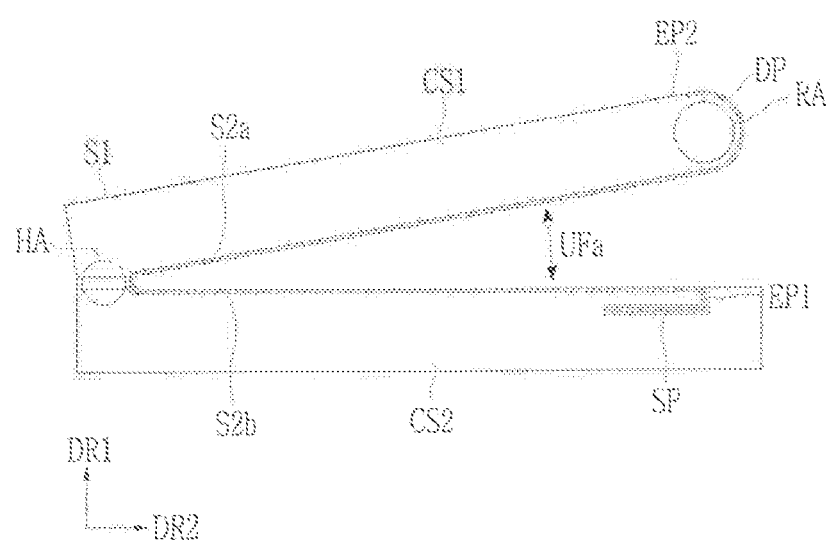

Next, referring to FIG. 9, in the state, in which most of the display panel DP is disposed on the second surface S2a of the first case CS1 and the third surface S2b of the second case CS2, the first case CS1 and the second case CS2 may be rotated about the folding member HA to form a first angle UFa by using the folding member HA, and the first case CS1 and the second case CS2 may move away from each other.

Figure 10:
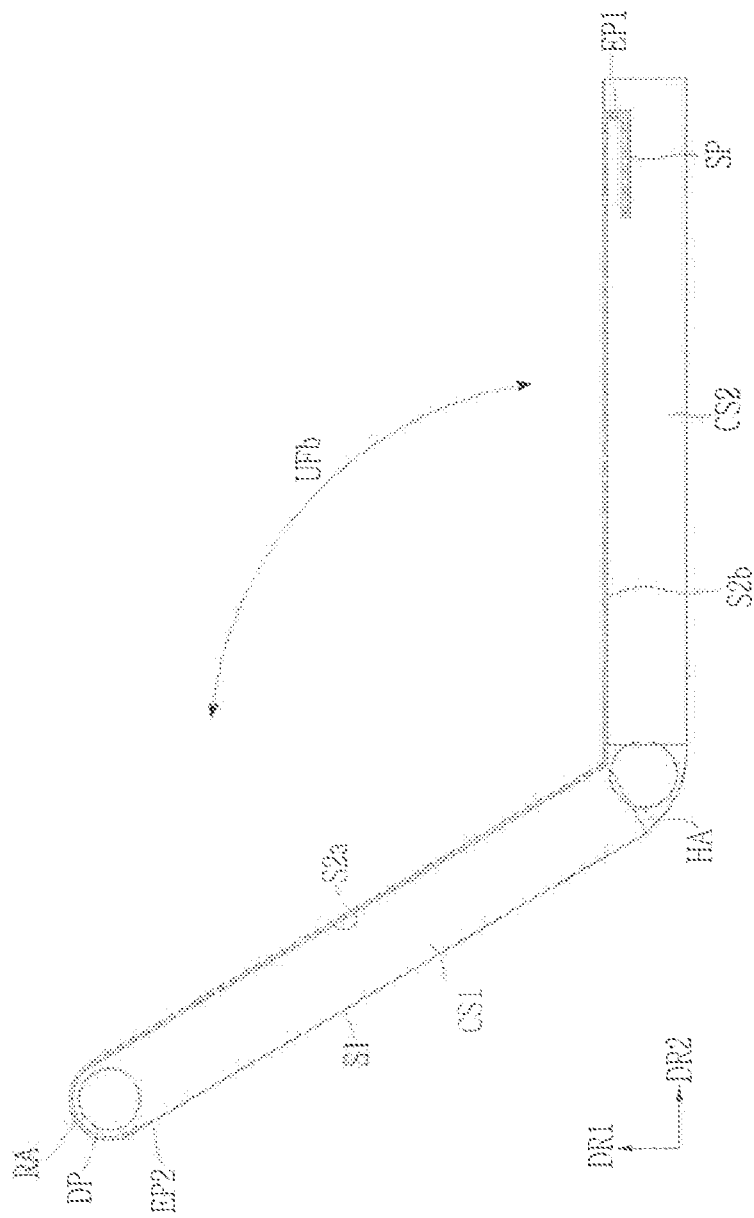

As shown in FIG. 10, in the state, in which most of the display panel DP is disposed on the second surface S2a of the first case CS1 and the third surface S2b of the second case CS2, the first case CS1 and the second case CS2 are rotated about the folding member HA to form a second angle UFa by using the folding member HA to further move away the first case CS1 and the second case CS2 from each other, so that an image may be displayed on the second display portion DA2 having the second width W2 in the unfolded second state as shown in FIG. 2.

Hereinafter, steps in which the display device is changed from the second state to the first state will be described with reference to FIG. 11 to FIG. 14 along with FIG. 1 to FIG. 10.

Figure 11:
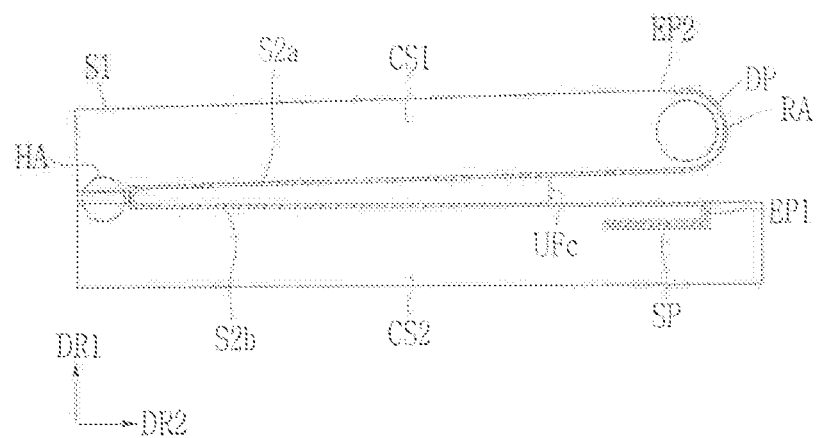
FIGS. 11, 12, 13, and 14 illustrate cross-sectional views of steps in which a display device is changed from a second state to a first state according to an embodiment of the present inventive concept.

Next, referring to FIG. 11 together with FIG. 2 and FIG. 10, in the state, in which most of the display panel DP is disposed on the second surface S2a of the first case CS1 and the third surface S2b of the second case CS2, the first case CS1 and the second case CS2 may be reversely rotated about the folding member HA to form a third angle UFc by using the folding member HA to move the first case CS1 and the second case CS2 closer to each other. For example, when the first case CS1 and the second case CS2 are reversely rotated about the folding member HA, the first case CS1 and the second case CS2 are brought closer to each other.

Figure 12:
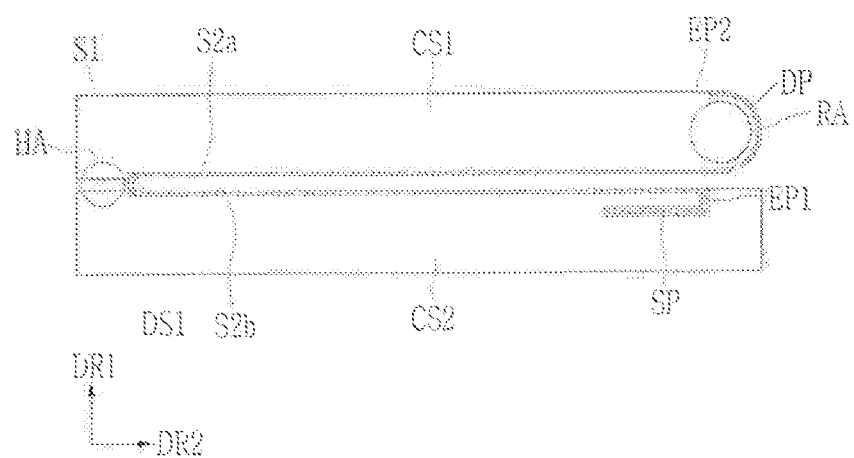

Then, as shown in FIG. 12, in the state, in which most of the display panel DP is disposed on the second surface S2a of the first case CS1 and the third surface S2b of the second case CS2, the first case CS1 and the second case CS2 may be folded to overlap each other along the first direction DR1 that is substantially perpendicular to the surface of the first display portion DAL.

Figure 13:
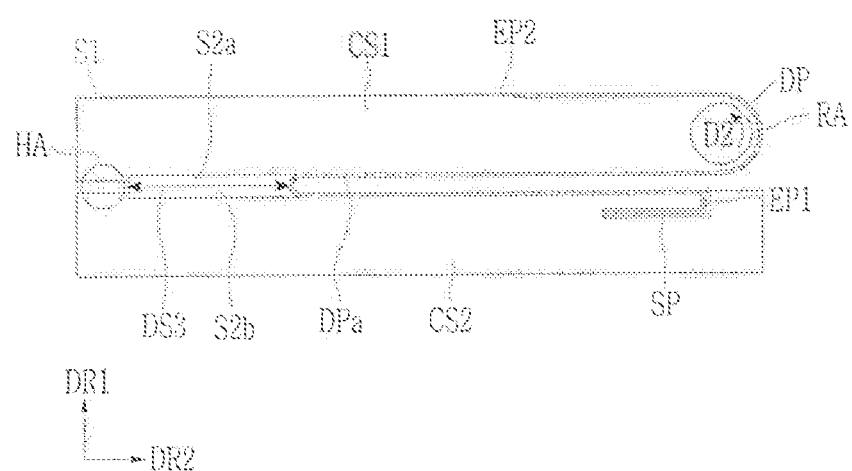

As shown in FIG. 13, the rotating member RA rotates in a second rotation direction D2, which is the opposite direction to the first rotation direction D1, and as the rotating member RA rotates in the second rotation direction D2, the display panel DP may move toward and along the first surface S1 of the first case CS1 according to the rotation direction of the rotating member RA.

As the rotating member RA rotates in the second rotation direction D2, the display panel DP moves, so that the distance between the first portion DPa of the display panel DP and the folding member HA, which are disposed between the second surface S2a of the first case CS1 and the third surface S2 of the second case CS2, may be increased from about 0 to a third distance DS3. The third distance DS3 may be narrower than the first distance DS1 between the first portion DPa of the display panel DP and the folding member HA shown in FIG. 1 above. In addition, the second end portion EP2 of the display panel DP disposed on the first surface S1 of the first case CS1 moves away from the rotation member RA more than in the example shown in FIG. 12.

Figure 14:
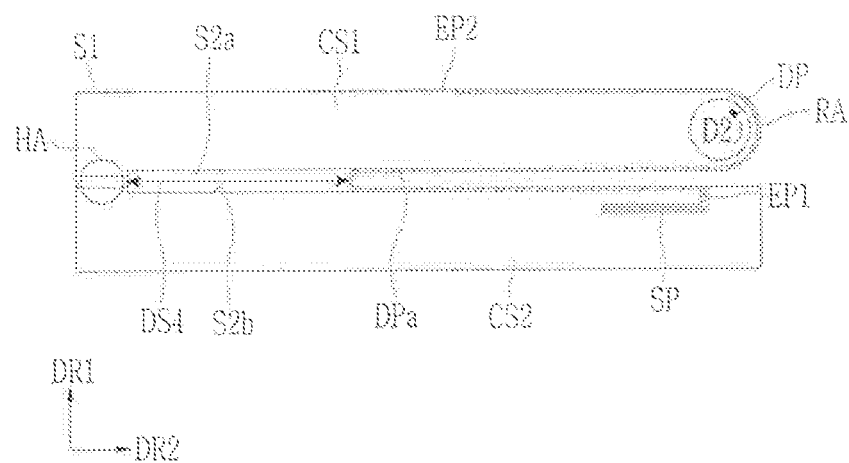

Referring to FIG. 14, as the rotating member RA continues to rotate in the second rotation direction D2, the display panel DP further moves toward and along the first surface S1 of the first case CS1 along the second rotation direction D2 of the rotating member RA, and the distance between the first portion DPa of the display panel DP and the folding member HA, which are disposed between the second surface S2a of the first case CS1 and the third surface S2 of the second case CS2, may become a fourth distance DS4 wider than the third distance DS3.

Until the distance between the first portion DPa of the display panel DP and the folding member HA, which are disposed between the second surface S2a of the first case CS1 and the third surface S2 of the second case CS2, becomes the first distance DS1, the rotating member RA is rotated and then stops the rotation when the first distance DS1 is reached, so that an image may be displayed on the first display portion DA1 that has the first width W1 in the first folded state as shown in FIG. 1.

According to the display device according to the present embodiment, the first end portion EP1 of the display panel DP is fixed in the accommodating portion SP of the second case CS2 and the position of the second end portion EP2 of the display panel DP is changed on the first surface S1 of first case CS1 according to the rotation direction of the rotating member RA, so that the folding and unfolding states of the display device may be changed by the folding member HA. Through this, by using one display panel DP, an image may be displayed on the first display portion DA1 having the first width W1 in the first state, in which the display device is folded, and an image may be displayed on the second display portion DA2 having the second width W2 in the second state, in which the display device is unfolded. Accordingly, the manufacturing cost of the display device and the driving cost of the display panel may be reduced.

While the present inventive concept has been shown and described with reference to the embodiments thereof, it will be apparent to those of ordinary skill in the art that various changes in form and detail may be made thereto without departing from the spirit and scope of the present inventive concept.

What is claimed is:

1. A display device comprising:
 a first case and a second case connected to each other by a folding member;
 a display panel that is at least partially disposed on a first surface of the first case,
 wherein a second surface of the first case is opposite to the first surface of the first case, wherein a third surface of the second case faces the second surface of the first case when the display device is in a folded state, and the third surface of the second case is coplanar with the second surface of the first case when the display device is in an unfolded state; and
 a rotating member connected to the first case, wherein the display panel wraps around the rotating member,
 wherein a first end portion of the display panel is fixed to the second case, and a position of a second end portion of the display panel is configured to change on the first surface of the first case.

2. The display device of claim 1,
 wherein the folding member and the rotating member are connected to respective end portions of the first case that are opposite to each other.

3. The display device of claim 2, wherein
 the display panel is disposed on the rotating member.

4. The display device of claim 3, wherein
the position of the second end portion of the display panel is configured to change according to a rotation of the rotating member.

5. The display device of claim 4, wherein
a first display portion of the display panel is positioned on the first surface of the first case, and
the first case and the second case overlap each other along a first direction that is substantially perpendicular to a surface of the first display portion when the display device is in the folded state.

6. The display device of claim 5, wherein
a first portion of the display panel is disposed between the second surface of the first case and the third surface of the second case facing each other along the first direction.

7. The display device of claim 6, wherein
the folding member and the first portion of the display panel are spaced apart from each other by a first distance.

8. The display device of claim 7, wherein
the first display portion of the display panel displays an image, and
the first portion of the display panel does not display an image.

9. The display device of claim 8, wherein
the second end portion of the display panel is disposed closer to the folding member than to the rotating member.

10. The display device of claim 9, wherein
the second case includes an accommodating portion, and
the first end portion of the display panel is disposed within the accommodating portion of the second case.

11. The display device of claim 4, wherein, when the display device is in the unfolded state,
the first case and the second case are disposed to be parallel to each other, and
a second display portion of the display panel is disposed on the second surface of the first case and the third surface of the second case.

12. The display device of claim 11, wherein
the second end portion of the display panel is disposed adjacent to the rotating member on the first surface of the first case.

13. The display device of claim 12, wherein
a height of the second surface of the first case and a height of the third surface of the second case are the same.

14. A display device comprising:
a first case and a second case connected to each other by a folding member;
a rotating member connected to the first case, wherein the rotating member is a roller; and
a display panel that is at least partially disposed on a first surface of the first case,
wherein a second surface of the first case is opposite to the first surface of the first case, and a third surface of the second case faces the second surface of the first case when the display device is in a first state, and the third surface of the second case is aligned with the second surface of the first case when the display device is in a second state,
wherein a first end portion of the display panel is fixed to the second case, and a position of a second end portion of the display panel is configured to change on the first surface of the first case, and
when the first case and the second case overlap each other, the display panel displays an image on a first display portion, and
when the second surface of the first case and the third surface of the second case are aligned with each other, the display panel displays an image on a second display portion.

15. The display device of claim 14, wherein
the first display portion has a first width, and the second display portion has a second width greater than the first width.

16. The display device of claim 15, wherein
the second width is approximately twice the first width.

17. The display device of claim 15, wherein
the folding member and the rotating member are connected to respective end portions of the first case that are opposite to each other.

18. The display device of claim 17, wherein
the display panel overlaps the rotating member.

19. The display device of claim 18, wherein
the position of the second end portion of the display panel is configured to change according to a rotation of the rotating member.

20. A display device comprising:
a first case and a second case connected to each other by a folding member, wherein the first case and the second case are configured to rotate about the folding member;
a rotating member disposed at a first end of the first case and configured to rotate; and
a display panel that is at least partially disposed on a first surface of the first case,
wherein a second surface of the first case is opposite to the first surface of the first case, wherein a third surface of the second case faces the second surface of the first case in a first direction when the display device is in a folded state, and the first case and the second case are arranged in a second direction when the display device is in an unfolded state, wherein the second direction crosses the first direction,
wherein a first end portion of the display panel is fixed to the second case, and a position of a second end portion of the display panel is disposed on the first surface of the first case, and
wherein, when the display device is in the folded state, a first portion of the display panel is disposed between the second surface of the first case and the third surface of the second case and is configured to move toward and away from the folding member as the rotating member rotates,
wherein the display panel wraps around the rotating member.

* * * * *